(12) United States Patent
Shi et al.

(10) Patent No.: US 9,985,008 B2
(45) Date of Patent: May 29, 2018

(54) METHOD OF FABRICATING A SEMICONDUCTOR PACKAGE

(71) Applicants: Hongbin Shi, Hwaseong-si (KR); Junho Lee, Suwon-si (KR)

(72) Inventors: Hongbin Shi, Hwaseong-si (KR); Junho Lee, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days. days.

(21) Appl. No.: 15/423,611

(22) Filed: Feb. 3, 2017

(65) Prior Publication Data

US 2017/0317062 A1    Nov. 2, 2017

(30) Foreign Application Priority Data

Apr. 28, 2016  (KR) .................. 10-2016-0052144

(51) Int. Cl.
| | | |
|---|---|---|
| *H01L 21/00* | (2006.01) | |
| *H01L 25/10* | (2006.01) | |
| *H01L 23/00* | (2006.01) | |
| *H01L 25/00* | (2006.01) | |

(52) U.S. Cl.
CPC ............ *H01L 25/105* (2013.01); *H01L 24/81* (2013.01); *H01L 25/50* (2013.01); *H01L 2224/81143* (2013.01); *H01L 2224/81815* (2013.01); *H01L 2225/1023* (2013.01); *H01L 2225/1058* (2013.01); *H01L 2225/1082* (2013.01)

(58) Field of Classification Search
CPC .......... H01L 33/62; H05K 2201/10234; H05K 2201/10659
See application file for complete search history.

(56) References Cited

U.S. PATENT DOCUMENTS

| | | | |
|---|---|---|---|
| 6,781,245 B2 | 8/2004 | Huang | |
| 2004/0183205 A1* | 9/2004 | Yamaguchi | ......... H01L 23/3128 257/774 |
| 2004/0217380 A1 | 11/2004 | Aoyagi | |
| 2011/0068481 A1* | 3/2011 | Park | ................... H01L 23/3128 257/777 |
| 2012/0126423 A1* | 5/2012 | Hatori | ................ H01L 23/3128 257/774 |

(Continued)

FOREIGN PATENT DOCUMENTS

| | | |
|---|---|---|
| JP | H11243156 A | 9/1999 |
| JP | 2002373914 A | 12/2002 |

(Continued)

*Primary Examiner* — Julio J Maldonado
*Assistant Examiner* — Andre' C Stevenson
(74) *Attorney, Agent, or Firm* — Volentine, Whitt & Francos, PLLC

(57) ABSTRACT

A method of fabricating a semiconductor package includes providing a lower semiconductor package including a lower package substrate, and a lower dummy ball and a lower solder ball on a top surface of the lower package substrate, providing an upper semiconductor package including an upper package substrate, and an upper dummy ball and an upper solder ball on a bottom surface of the upper package substrate, joining the upper dummy ball to the lower dummy ball at a first temperature to form a solder joint, and joining the upper solder ball to the lower solder ball at a second temperature to form a connection terminal.

16 Claims, 11 Drawing Sheets

(56) References Cited

U.S. PATENT DOCUMENTS

2012/0306102 A1* 12/2012 Cho .................... H01L 23/3128
                                                                                  257/777
2015/0348957 A1    12/2015  Lin et al.
2015/0357319 A1    12/2015  Yu et al.
2015/0371936 A1    12/2015  Chen et al.

FOREIGN PATENT DOCUMENTS

| JP | 200331614 A | 1/2003 |
| JP | 200612883 A | 1/2006 |
| KR | 020070075718 A | 7/2007 |
| KR | 1020110139367 A | 12/2011 |

\* cited by examiner

METHOD OF FABRICATING A SEMICONDUCTOR PACKAGE

PRIORITY STATEMENT

This U.S. non-provisional patent application claims priority under 35 U.S.C. § 119 to Korean Patent Application No. 10-2016-0052144, filed on Apr. 28, 2016, in the Korean Intellectual Property Office, the entire contents of which are hereby incorporated by reference.

BACKGROUND

The inventive concept relates to a semiconductor package and to a method of fabricating the same. In particular, the inventive concept relates to a package on package semiconductor device and to a method of fabricating the same In the semiconductor industry, there is an increasing demand for high-performance, high-speed, and compact semiconductor devices and/or electronic appliances therewith. To meet such a demand, various semiconductor packaging techniques have been proposed. For example, there have been suggested methods of stacking a plurality of semiconductor chips on a single substrate or of stacking a semiconductor package on another semiconductor package. In these cases, it is necessary to connect semiconductor packages with high connection reliability.

SUMMARY

According to the inventive concept, there is provided a method of fabricating a semiconductor package, including providing a lower semiconductor package comprising a lower package substrate and a lower dummy ball and a lower solder ball on a top surface of the lower package substrate, providing an upper semiconductor package comprising an upper package substrate and an upper dummy ball and an upper solder ball on a bottom surface of the upper package substrate, joining the upper dummy ball to the lower dummy ball at a first temperature, and joining the upper solder ball to the lower solder ball at a second temperature to form a connection terminal.

According to the inventive concept, there is also provided a method of fabricating a semiconductor package, including providing a lower semiconductor package with first and second solder pads, stacking an upper semiconductor package including an upper solder ball and an upper dummy ball on the lower semiconductor package, and performing a reflow process to connect the upper semiconductor package to the lower semiconductor package, and in which the reflow process comprises a first process of joining the upper dummy ball to the first solder pad, the upper solder ball being aligned with the lower solder ball during the first process, and a second process of joining the upper solder ball to the second solder pad, and in which a process temperature in the first process is higher than that in the second process.

According to the inventive concept, there is also provided a method of fabricating a semiconductor package, including providing a lower semiconductor device package comprising a lower package substrate, a lower package chip mounted to the lower package substrate, and conductive members disposed on an upper side of the lower package substrate, providing an upper semiconductor device package comprising an upper package substrate, an upper package chip mounted to the upper package substrate, and conductive members disposed on a lower side of the upper package substrate, forming a pre-assemblage comprising the lower and upper semiconductor device packages and in which the lower side of the upper package substrate faces the upper side of the lower package substrate, and dummy members are interposed between the lower side of the upper package substrate and the upper side of the lower package substrate, and connecting the lower and upper semiconductor device packages of the pre-assemblage to each other both physically and electrically, and in which the conductive members comprise solder, the connecting of the lower and upper semiconductor device packages of the pre-assemblage includes liquefying the dummy members such that surface tension is created at surfaces of the liquefied dummy members, and forming internal electrical connections of the PoP including by reflowing the solder, and the dummy members are liquefied before the solder is reflowed.

BRIEF DESCRIPTION OF THE DRAWINGS

The inventive concept will be more clearly understood from the following brief description of non-limiting examples thereof taken in conjunction with the accompanying drawings.

It should be noted that these figures are intended to illustrate the general characteristics of methods, structure and/or materials of certain examples and to supplement the written description provided below. These drawings are not, however, to scale and may not precisely reflect the precise structural or performance characteristics of any given example, and should not be interpreted as defining or limiting the range of values or properties encompassed by the inventive concept. For example, the relative thicknesses and positioning of molecules, layers, regions and/or structural elements may be reduced or exaggerated for clarity. The use of similar or identical reference numbers in the various drawings is intended to indicate the presence of a similar or identical elements or features.

DETAILED DESCRIPTION

Figure 1A:
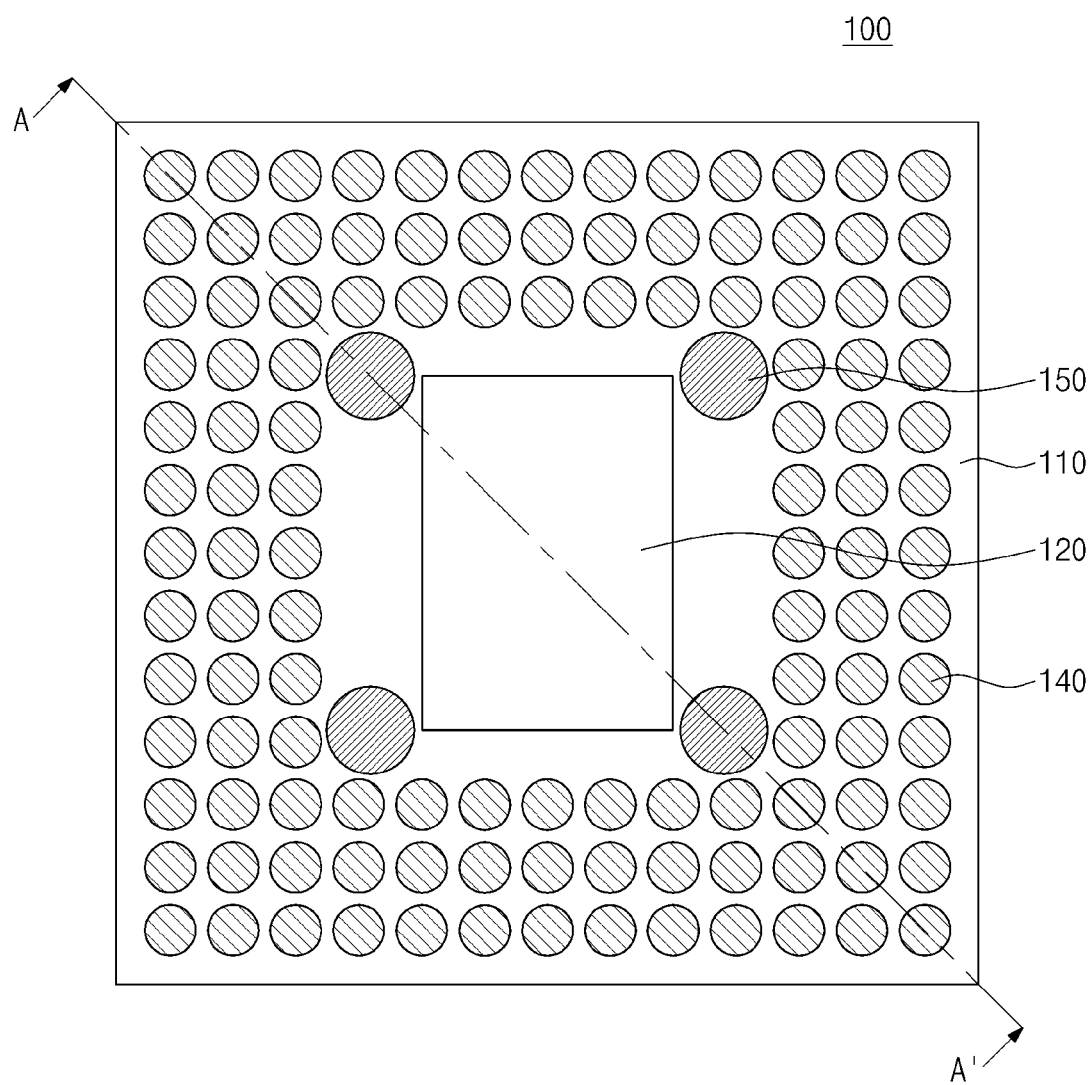
FIG. 1A is a plan view of a lower semiconductor package of examples of a package on package device according to the inventive concept.
Figure 1B:
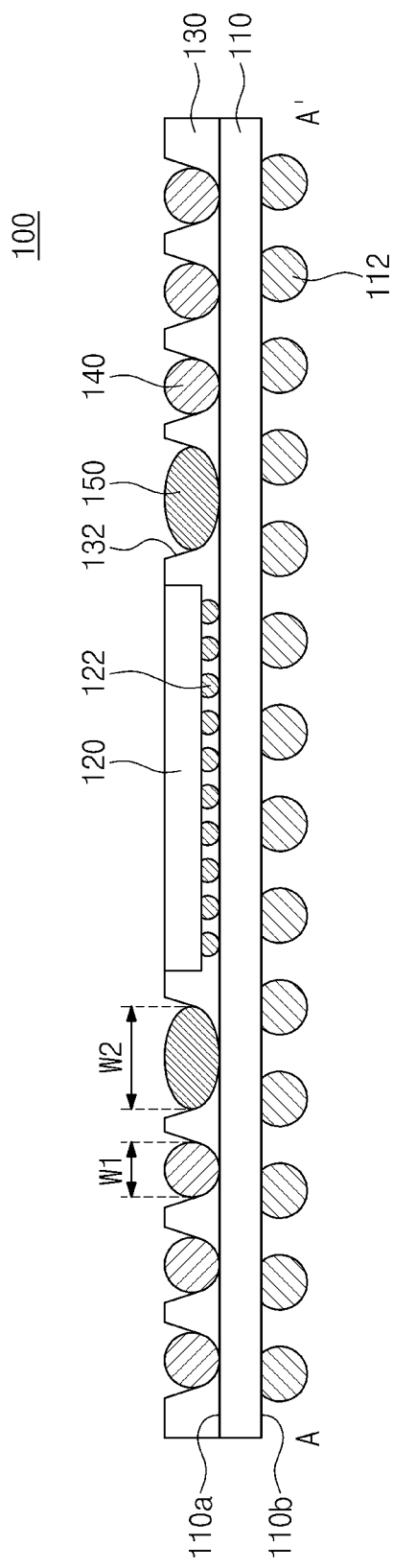
FIG. 1B is a sectional view taken along line A-A' of FIG. 1A.
Figure 1C:
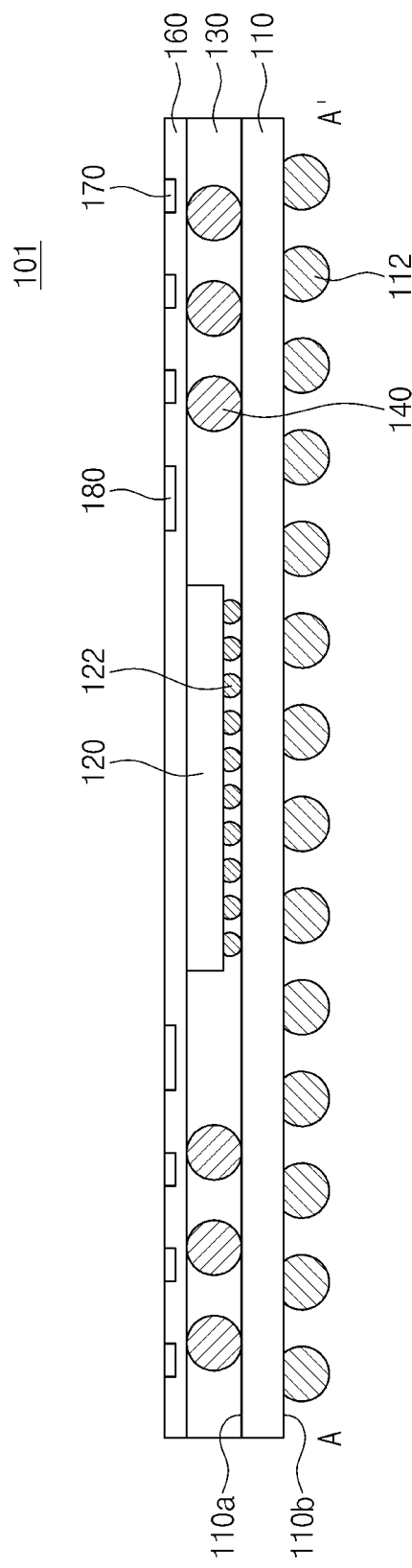
FIG. 1C is a sectional view illustrating another example of a lower semiconductor package of a package on package according to the inventive concept.
Figure 2A:
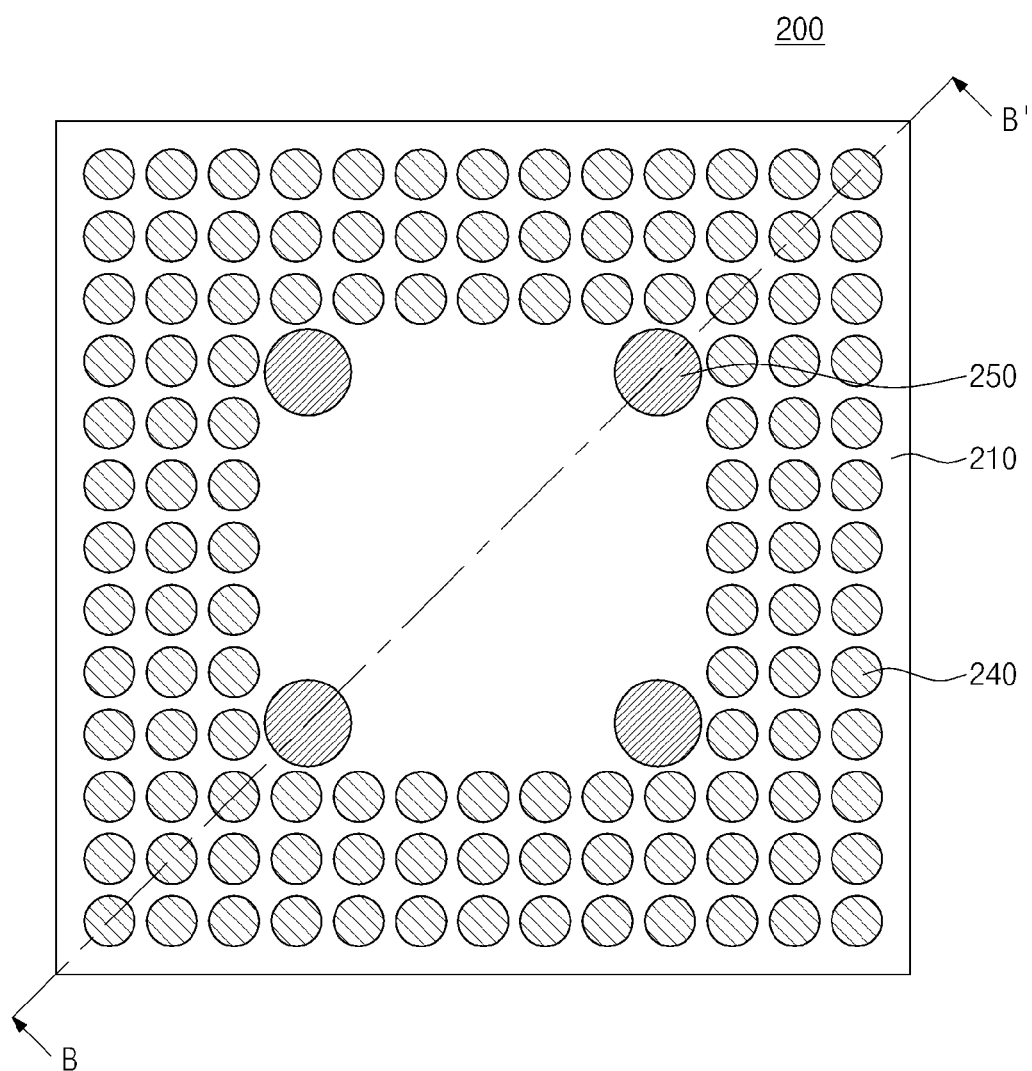
FIG. 2A is a bottom view of an upper semiconductor package of examples of a package on package according to the inventive concept.
Figure 2B:
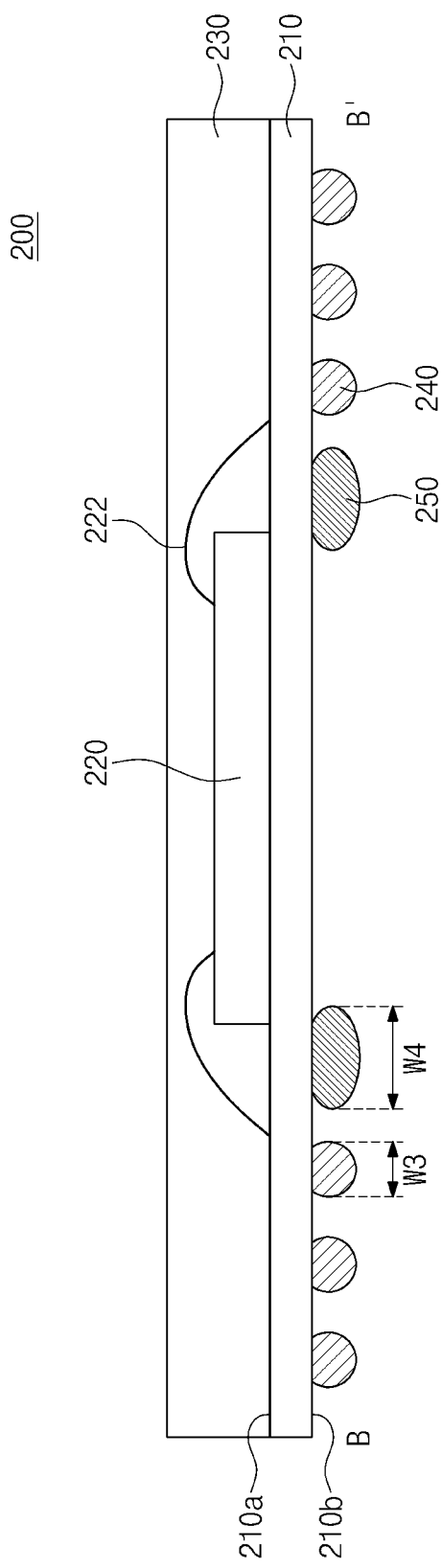
FIG. 2B is a sectional view taken along line B-B' of FIG. 2A.

FIG. 1A is a plan view of a lower semiconductor package 100 according to the inventive concept. FIG. 1B is a sectional view taken along line A-A' of FIG. 1A. FIG. 1C is a sectional view illustrating a lower semiconductor package 101 according to the inventive concept. FIG. 2A is a bottom view of an upper semiconductor package 200 according to the inventive concept. FIG. 2B is a sectional view taken along line B-B' of FIG. 2A.

Referring to FIGS. 1A and 1B, the lower semiconductor package 100 may include a lower package substrate 110, a lower semiconductor chip 120, a lower mold layer 130, a lower solder ball 140, and a lower dummy ball 150. Here, and in the description that follows, certain elements such as the solder ball 140 and lower dummy ball 150 will be described in the singular for the sake of convenience, although such elements may be provided in multiples as shown in the drawings and in real life examples according to the inventive concept. Also, here and in the description that follows, the term "ball" may not necessarily be used to describe a perfectly or substantially spherical object but may merely indicate that the object has a generally circular shape as viewed in plan as shown in FIG. 1A, for example.

The lower package substrate 110 may have a first top surface 110a and a first bottom surface 110b facing in opposite directions. The lower package substrate 110 may be a printed circuit board (PCB) with circuit patterns or a redistribution substrate. An external terminal 112 (e.g., a solder ball or a solder bump) may be provided on the first bottom surface 110b of the lower package substrate 110.

The lower semiconductor chip 120 may be a logic chip or a memory chip. In an example in which the lower semiconductor chip 120 is a logic chip, the logic chip may be configured to include a logic element and a memory element. In examples in which the lower semiconductor chip 120 is a memory chip, the memory chip may include at least one of a DRAM, NAND FLASH, NOR FLASH, One-NAND, PRAM, ReRAM, and MRAM device. Furthermore, the lower semiconductor chip 120 may be mounted on the first top surface 110a of the lower package substrate 110. For example, the lower semiconductor chip 120 may be mounted on the lower package substrate 110 by using a flip-chip bonding method. In other words, the lower semiconductor chip 120 may be electrically connected to the lower package substrate 110 through a connection terminal 122 (e.g., a solder ball or a solder bump). However, the inventive concept is not limited thereto; for example, the lower semiconductor chip 120 may be electrically connected to the lower package substrate 110 through a bonding wire (not shown).

The lower mold layer 130 may be provided on the lower package substrate 110 to enclose the lower semiconductor chip 120. The lower mold layer 130 may be formed of or include an insulating polymer material (e.g., an epoxy molding compound (EMC)). In some examples, the lower mold layer 130 may be provided to expose a top surface of the lower semiconductor chip 120. In certain examples, although not shown, the lower mold layer 130 may be provided to cover the top surface of the lower semiconductor chip 120. In addition, connection holes 132 may be provided through the lower mold layer 130. The connection holes 132 may be spaced apart from the lower semiconductor chip 120. As an example, the connection holes 132 are provided to be symmetric about the lower semiconductor chip 120.

The lower solder ball 140 and the lower dummy ball 150 may be provided in the connection holes 132 and may be in contact with the lower package substrate 110. For example, when viewed in plan, the lower solder ball 140 may be closer to an edge of the lower package substrate 110 than the lower dummy ball 150. In other words, the lower dummy ball 150 may be closer to the lower semiconductor chip 120 than the lower solder ball 140. When viewed in plan, a width w2 of the lower dummy ball 150 may be greater than a width w1 of the lower solder ball 140.

Moreover, the lower solder ball 140 may be electrically connected to the lower package substrate 110. On the other hand, as the name implies, the lower dummy ball 150 may be electrically isolated so as not to form any electrical connection in the final package. Also, a volume of the lower dummy ball 150 may be greater than that of the lower solder ball 140. This may allow a connection solder, which may be formed through a subsequent process of melting an upper dummy ball and the lower dummy ball 150, to have an increased surface tension. The lower dummy ball 150 may have a melting point ranging from 128° C. to 216° C. For example, the lower dummy ball 150 may be formed of or include $Bi_{58}Sn_{42}$, $In_{97}Ag_3$, $In_{90}Ag_{10}$, $In_{75}Pb_{25}$, $In_{70}Pb_{30}$, $In_{60}Pb_{40}$, $In_{50}Sn_{50}$, $In_{52}Sn_{48}$, $Sn_{86.5}Zn_{5.5}In_{4.5}Bi_{3.5}$, $Bi_{57}Sn_{42}Ag_1$, $Sn_{43}Pb_{43}Bi_{14}$, $Sn_{46}Pb_{46}Bi_8$, $Bi_{52}Pb_{32}Sn_{16}$, or $Bi_{46}Sn_{34}Pb_{20}$. The lower solder ball 140 may be formed of or include a material whose melting point is higher than that of the lower dummy ball 150. For example, the lower solder ball 140 may be formed of or include $Sn_{96.5}Ag_3Cu_{0.5}$, $Sn_{96.8}Ag_3Cu_{0.2}$, or $Sn_{97}Ag_{2.5}Cu_{0.5}$. The lower solder ball 140 may be provided on the first top surface 110a of the lower package substrate 110 and may be electrically connected to the lower package substrate 110 and the lower semiconductor chip 120. In the present specification, the term "solder" may refer to a conductive material (e.g., tin, gold, silver, or copper) or alloys thereof (e.g., Sn—In, Sn—Au, Sn—Cu, or Sn—Bi), and the term "solder ball" may refer to a conductive element with a spherical shape or the like.

As an alternative to the example shown in FIG. 1B, the lower semiconductor package 101 may further include an interposer substrate 160 a shown in FIG. 1C. Referring to FIG. 1C, the interposer substrate 160 may be provided on the lower semiconductor chip 120 and the lower mold layer 130. A first solder pad 170 and a second solder pad 180 may be provided on a top surface of the interposer substrate 160. When viewed in plan, the second solder pad 180 may be closer to the lower semiconductor chip 120 than the first solder pad 170. A width of the second solder pad 180 may be greater than that of the first solder pad 170. The first solder pad 170 may be electrically connected to the lower package substrate 110 through the lower solder ball 140. In certain examples, the lower dummy ball 150 is omitted. For convenience, the description that follows will refer to the lower semiconductor package 100 of FIG. 1B, but the method to be described below can be applied to the structure of FIG. 1C in the same manner.

Referring to FIGS. 2A and 2B, the upper semiconductor package 200 may include an upper package substrate 210, an upper semiconductor chip 220, an upper mold layer 230, an upper solder ball 240, and an upper dummy ball 250.

The upper package substrate 210 may have a second top surface 210a and a second bottom surface 210b facing in opposite directions. The upper package substrate 210 may be a printed circuit board (PCB) with circuit patterns.

The upper semiconductor chip 220 may be mounted on the second top surface 210a of the upper package substrate 210. For example, the upper semiconductor chip 220 may be mounted on the upper package substrate 210 by using a wire bonding method. In other words, the upper semiconductor chip 220 may be electrically connected to the upper package substrate 210 through a bonding wire 222. Furthermore, the upper semiconductor chip 220 may be attached to the upper package substrate 210 by an insulating adhesive layer (not shown) interposed therebetween. The upper semiconductor chip 220 may be a logic chip or a memory chip. Although FIG. 2B shows the upper semiconductor package 200 having a single upper semiconductor chip, the inventive concept is not limited thereto. The upper semiconductor package 200 may include at least two upper semiconductor chips stacked on the upper package substrate 210.

The upper mold layer 230 may be provided on the upper package substrate 210 to enclose the upper semiconductor chip 220. For example, the upper mold layer 230 may cover the upper semiconductor chip 220 and the second top surface 210a of the upper package substrate 210. The upper mold layer 230 may be formed of or include an insulating polymer material (e.g., epoxy molding compound (EMC)).

The upper solder ball 240 and the upper dummy ball 250 may be provided on the second bottom surface 210b of the upper package substrate 210. For example, when viewed in plan, the upper solder ball 240 may be closer to an edge of the upper package substrate 210 than the upper dummy ball 250. Here, the upper solder ball 240 and the upper dummy ball 250 may be provided at positions corresponding to the lower solder ball 140 and the lower dummy ball 150, respectively. When viewed in plan, a width w4 of the upper dummy ball 250 may be greater than a width w3 of the upper solder ball 240.

Moreover, the upper solder ball 240 may be electrically connected to the upper semiconductor chip 220 through the upper package substrate 210. On the other hand, as the name implies, the upper dummy ball 250 may be electrically isolated so as not form any electrical connection in the final package. Also, a volume of the upper dummy ball 250 may be greater than that of the upper solder ball 240, and this may allow a connection solder, which may be formed through a subsequent process of melting the upper dummy ball 250 and the lower dummy ball 150, to have an increased surface tension. In some examples, the upper dummy ball 250 may be formed of or include the same material as the lower dummy ball 150. In other words, the upper dummy ball 250 may have a melting point ranging from 128° C. to 216° C. For example, the upper dummy ball 250 may be formed of or include $Bi_{58}Sn_{42}$, $In_{97}Ag_3$, $In_{90}Ag_{10}$, $In_{75}Pb_{25}$, $In_{70}Pb_{30}$, $In_{60}Pb_{40}$, $In_{50}Sn_{50}$, $In_{52}Sn_{48}$, $Sn_{86.5}Zn_{5.5}In_{4.5}Bi_{3.5}$, $Bi_{57}Sn_{42}Ag_1$, $Sn_{43}Pb_{43}Bi_{14}$, $Sn_{46}Pb_{46}Bi_8$, $Bi_{52}Pb_{32}Sn_{16}$, or $Bi_{46}Sn_{34}Pb_{20}$. A melting point of the upper solder ball 240 may be higher than that of the upper dummy ball 250. The upper solder ball 240 may be formed of or include the same material as the lower solder ball 140. For example, the upper solder ball 240 may be formed of or include $Sn_{96.5}Ag_3Cu_{0.5}$, $Sn_{96.8}Ag_3Cu_{0.2}$, or $Sn_{97}Ag_{2.5}Cu_{0.5}$. The upper solder ball 240 may be attached to the second bottom surface 210b of the upper package substrate 210 and may be electrically connected to the upper package substrate 210 and the upper semiconductor chip 220.

Hereinafter, a method of fabricating a semiconductor package according to the inventive concept will be described. For the sake of brevity, a previously described element may be identified by a similar or identical reference number without repeating a description of detailed aspects thereof.

FIGS. 3 to 8 are sectional views illustrating a method of fabricating a semiconductor package, according to the inventive concept.

Figure 3:
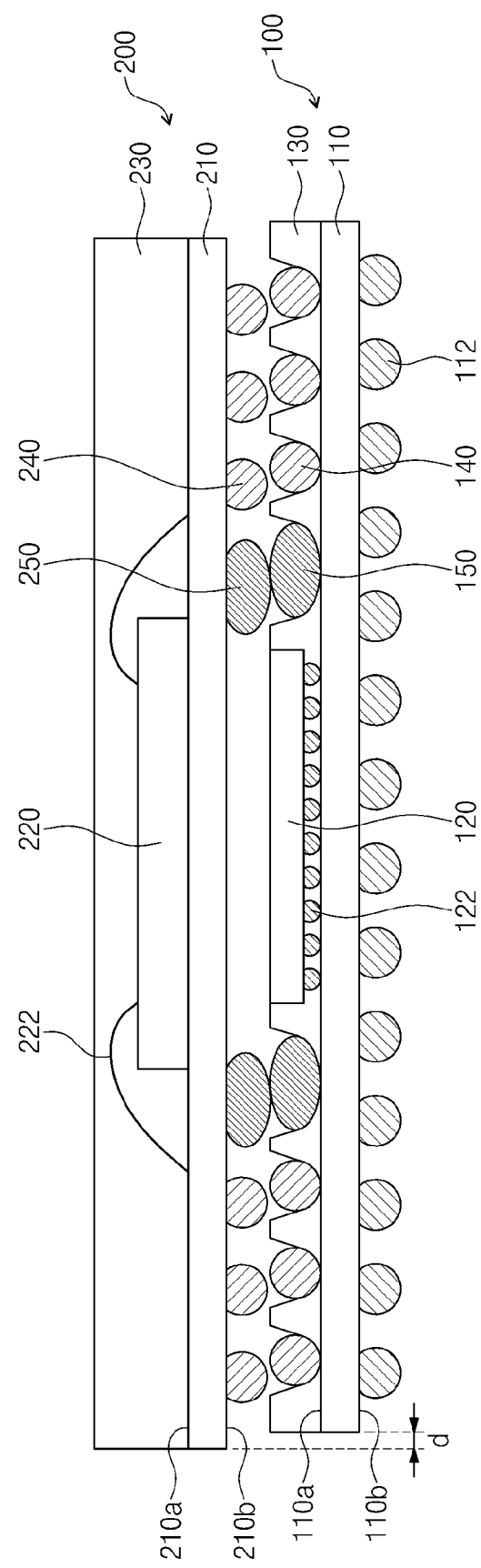
FIGS. 3, 4, 5 and 6 are sectional views of a package on package semiconductor device during the course of its manufacture and together illustrating a method of fabricating the same according to the inventive concept.

Referring to FIG. 3, the upper semiconductor package 200 may be disposed on the lower semiconductor package 100. The lower semiconductor package 100 may be prepared to have substantially the same features as those described with reference to FIGS. 1A and 1B. For example, the lower semiconductor package 100 may be prepared to include the lower package substrate 110, the lower semiconductor chip 120, the lower mold layer 130, the lower solder ball 140, and the lower dummy ball 150.

The upper semiconductor package 200 may be prepared to have substantially the same features as those described with reference to FIGS. 2A and 2B. For example, the upper semiconductor package 200 may be prepared to include the upper package substrate 210, the upper semiconductor chip 220, the upper mold layer 230, the upper solder ball 240, and the upper dummy ball 250.

The upper solder ball 240 and the upper dummy ball 250 may be provided at positions corresponding to the lower solder ball 140 and the lower dummy ball 150, respectively. In other words, when viewed in plan, the upper solder ball 240 may be disposed on the lower solder ball 140, and the upper dummy ball 250 may be disposed on the lower dummy ball 150. In certain cases, the upper solder ball 240 and the lower solder ball 140 may be misaligned, and the upper dummy ball 250 and the lower dummy ball 150 may be misaligned from each other. Such misalignments may be caused by, for example, a mechanical error of a fabrication system.

As a result, a pre-assemblage of a package-on-package type of semiconductor package is formed. FIG. 3 shows an example of the pre-assemblage in which the lower and upper semiconductor packages 100 and 200 are misaligned (i.e., laterally offset from one another in a given horizontal direction) by a distance d.

Figure 4:
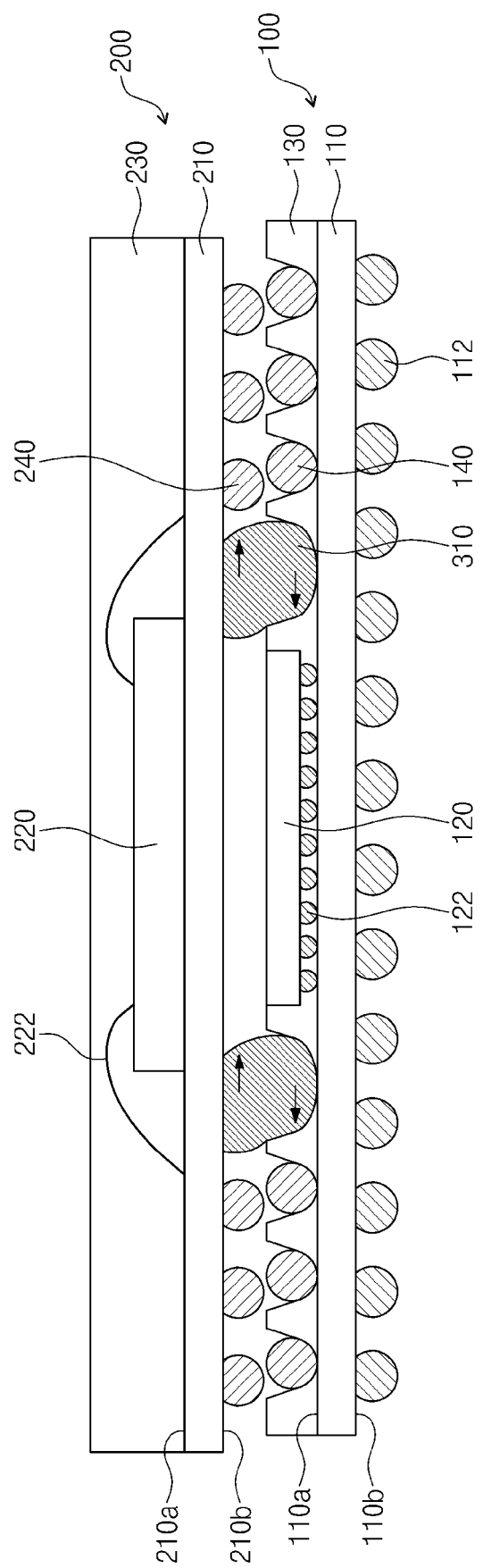
Figure 5:
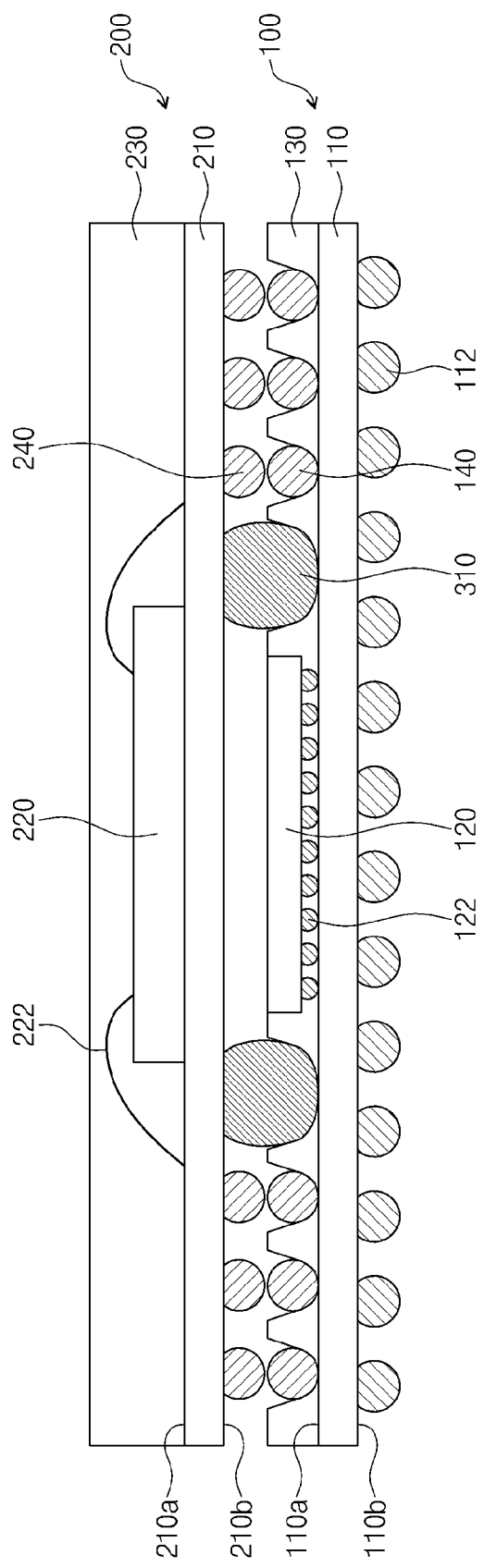

Referring to FIGS. 4 and 5, a first process may be performed to join the upper dummy ball 250 to the lower dummy ball 150. The first process may be performed at a first temperature. The first temperature may be lower than a melting point of the upper and lower solder balls 240 and 140 and higher than a melting point of the upper and lower dummy balls 250 and 150. In some examples, the first temperature may range from 128° C. to 216° C. Accordingly, the upper and lower dummy balls 250 and 150 may be melted and fused into a single solder joint. For example, the upper and lower dummy balls 250 and 150 may be fused to form connection solder 310.

As a result of the first process, the lower and upper semiconductor packages 100 and 200 may be self-aligned. More specifically, when the connection solder 310 is in a liquid state, the connection solder 310 may have a surface energy that is proportional to its surface area. As a result, upper and lower portions of the connection solder 310 may shift laterally relative to each other in the directions represented by the arrows shown in FIG. 4. That is, the connection solder 310 may have a surface area that is greater than the surface area is would otherwise possess in the case in which the lower and upper semiconductor packages 100 and 200 were aligned to begin with. Accordingly, the connection solder 310 may be deformed, due to surface tension, in such a way as to reduce its surface area. Accordingly, the upper and lower portions of the connection solder 310 may become aligned, as shown in FIG. 5. At this time, the upper solder ball 240 may also be aligned with the lower solder ball 140. In other words, the upper solder ball 240 of the upper semiconductor package 200 and the lower solder ball 140 of the lower semiconductor package 100 may be aligned due to the surface tension created in the connection solder 310.

Meanwhile, in the case in which the width w2 of the upper dummy ball 250 and the width w4 of the lower dummy ball 150 are relatively great, the connection solder 310 may have a relatively large volume and a correspondingly great surface area. The surface area of the connection solder 310 may be proportional to the surface tension, and a large surface area may thus make it possible to effectively align the upper semiconductor package 200 and the lower semiconductor package 100. Subsequently, the second process may be performed in the same chamber as the first process, under an increasing temperature condition.

Figure 6:
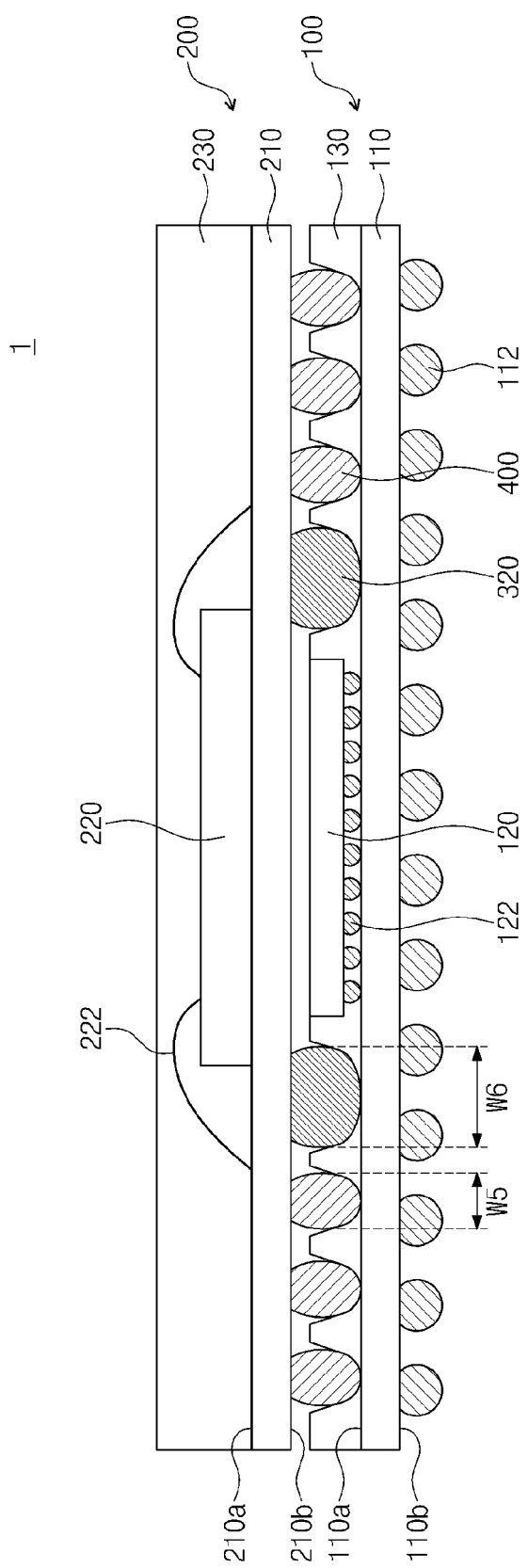

Referring to FIG. 6, the second process may be performed to connect the lower semiconductor package 100 to the upper semiconductor package 200 and thereby to form a semiconductor package 1. For example, during the second process, the lower solder ball 140 and the upper solder ball 240 may be joined or melded to form a connection terminal 400 constituting an internal electrical connection in the semiconductor package 1. That is, the lower semiconductor package 100 may be electrically and physically connected to the upper semiconductor package 200 through the connection terminal 400. The second process may be performed at a second temperature. The second temperature may be substantially equal to or higher than the melting point of the upper and lower solder balls 240 and 140. For example, the second temperature may range from 217° C. to 245° C. That is, the second process at the second temperature may lead to a reflowing or melting of the solder of the upper and lower solder balls 240 and 140. Subsequently, the process temperature may be reduced to the room temperature. As the process temperature decreases below the second temperature, the upper and lower solder balls 240 and 140 in a liquid state may be solidified to fuse to one another and form the connection terminal 400. The connection terminal 400 may be an alloy, in which materials that formed the lower solder ball 140 and the upper solder ball 240 are mixed. Also, as the process temperature decreases below the first temperature, the connection solder 310 may be solidified to form a dummy terminal 320. The lower semiconductor package 100 may be physically connected to the upper semiconductor package 200 through the dummy terminal 320. The dummy terminal 320 is electrically isolated in the resulting semiconductor package 1, e.g., is electrically isolated from at least external terminal 112.

As a result of the above process, the semiconductor package 1 may include the lower semiconductor package 100, the upper semiconductor package 200, the connection terminal 400, and the dummy terminal 320.

The connection terminal 400 and the dummy terminal 320 may be disposed between the lower semiconductor package 100 and the upper semiconductor package 200. The connection terminal 400 and the dummy terminal 320 may be disposed at an outskirt of the lower semiconductor chip 120. When viewed in plan, the dummy terminal 320 may be disposed closer to the lower semiconductor chip 120 than the connection terminal 400. Also, the width w6 of the dummy terminal 320 may be greater than the width w5 of the connection terminal 400. The connection terminal 400 may connect the lower semiconductor package 100 electrically with the upper semiconductor package 200. The dummy terminal 320 may allow the semiconductor package 1 to have high resistance to thermal stress. For example, when there is a variation in temperature of the semiconductor package 1, the semiconductor package 1 may suffer from thermal stress, which may occur due to a difference in coefficients of thermal expansion of the package substrates 110 and 210 and the semiconductor chips 120 and 220. The magnitude of the thermal stress may increase with decreasing distance from the semiconductor chips 120 and 220. According to some examples of the inventive concept, the semiconductor package 1 may include the dummy terminal 320 that is disposed adjacent to the semiconductor chips 120 and 220. The dummy terminal 320 may absorb the thermal stress caused by the difference in coefficients of thermal expansion, and thus, it may be possible to prevent the connection terminal 400 from being damaged by the thermal stress.

Figure 7:
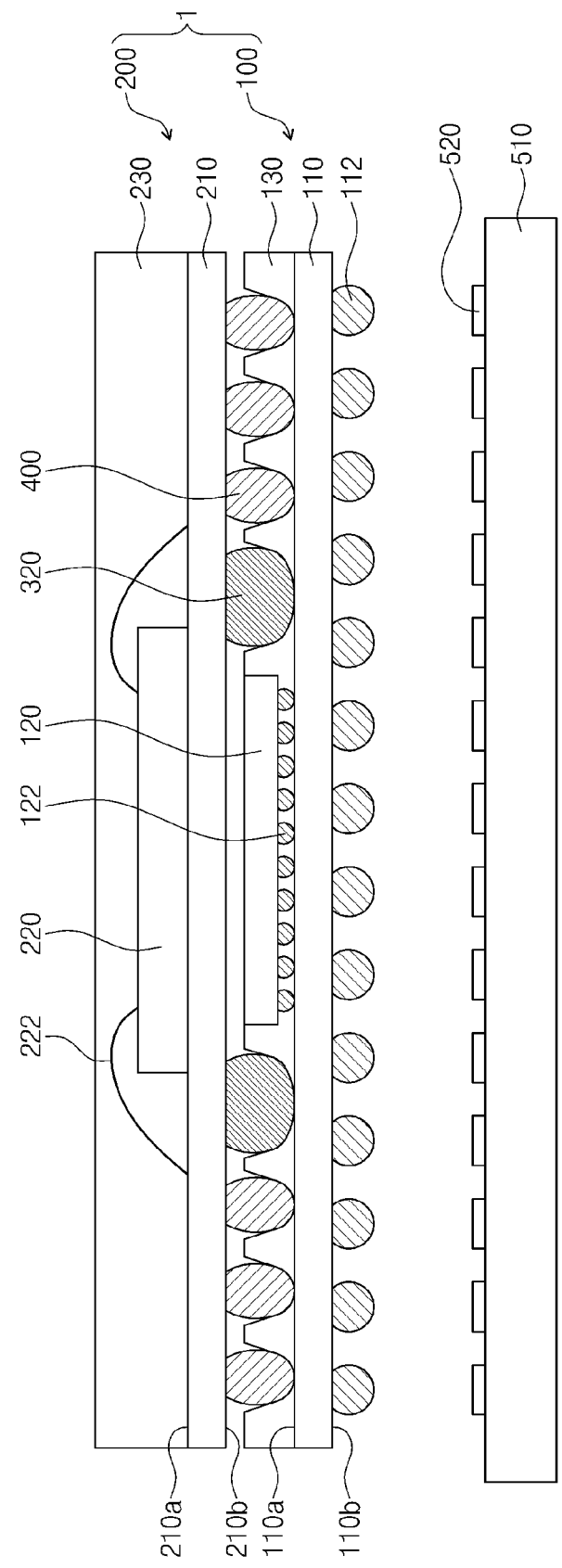
FIGS. 7 to 8 are sectional views of a package on package semiconductor device during the course of its manufacture and together illustrating other examples of a method of fabricating the same according to the inventive concept.
Figure 8:
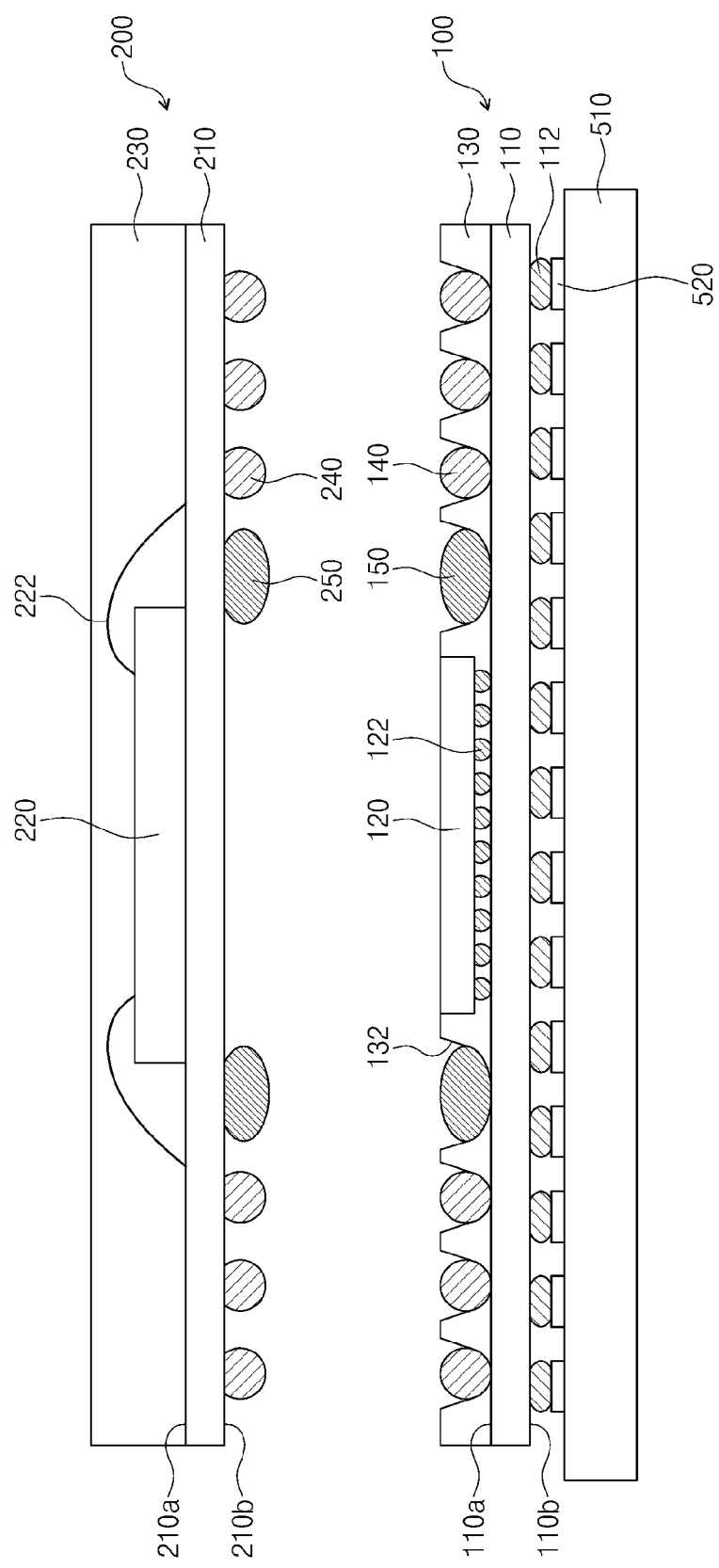

FIGS. 7 to 8 are sectional views illustrating a method of fabricating a semiconductor package, according to other examples of the inventive concept.

Referring to FIG. 7, the semiconductor package 1 of FIG. 6 may be mounted on a board 510. The board 510 may be a board for a mobile device (e.g., a cellular phone) or a memory module. A board terminal 520 may be provided on the board 510. The board terminal 520 may be connected to the external terminal 112 to electrically connect the board 510 to the semiconductor package 1.

In certain examples, the connection of the external terminal 112 and the board terminal 520 may be performed before the first process. Referring to FIG. 8, the board terminal 520 and the external terminal 112 may be joined to electrically connect the board 510 to the lower semiconductor package 100. Subsequently, the first process and the second process may be performed to connect the upper semiconductor package 200 to the lower semiconductor package 100.

In certain examples, the connection of the external terminal 112 and the board terminal 520 may be performed during the second process of attaching the upper solder ball 240 to the lower solder ball 140. For example, the second process may include a reflow process, and the external terminal 112 and the board terminal 520 may be joined during the reflow process.

According to some examples of the inventive concept, a semiconductor package may be fabricated by mounting the upper semiconductor package 200 of FIG. 2B on the lower semiconductor package 101 including the interposer substrate 160 (e.g., as shown in FIG. 1C). Except for that, in these examples the method of fabricating a semiconductor package may be the same as that described with reference to FIGS. 3 to 6.

Figure 9:
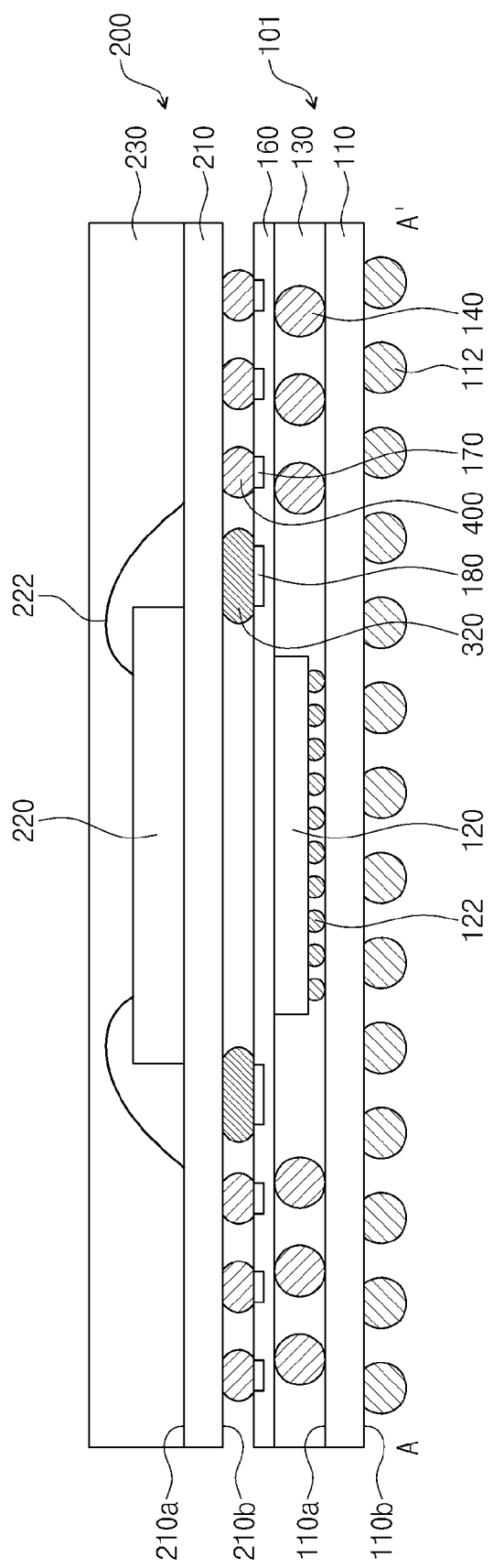
FIG. 9 is a sectional view illustrating an example of a package on package semiconductor device according to the inventive concept.

FIG. 9 is a sectional view illustrating a semiconductor package according to another example of the inventive concept.

Referring to FIGS. 1C, 2B, and 9, the upper semiconductor package 200 may be provided on the lower semiconductor package 101. When viewed in plan, the upper solder ball 240 may be disposed on the first solder pad 170, and the upper dummy ball 250 may be disposed on the second solder pad 180. In certain cases, the upper solder ball 240 may be misaligned with the first solder pad 170, and the upper dummy ball 250 may be misaligned with the second solder pad 180.

A first process may be performed to attach the upper dummy ball 250 to the second solder pad 180. The first process may be performed at a first temperature, which is lower than a melting point of the upper solder ball 240 and higher than a melting point of the upper dummy ball 250. Accordingly, during the first process, the upper dummy ball 250 may be melted to form the connection solder 310. Similar to the example of FIGS. 4 and 5, the lower semiconductor package 101 may be self-aligned with the upper semiconductor package 200 during the first process. For example, an upper portion of the connection solder 310 may be laterally offset from a lower portion thereof. This may lead to an increase in surface area of the connection solder 310, compared with the case in which there is no misalignment, and in the case of a misalignment, due to surface tension, the connection solder 310 may be deformed to have a reduced surface area. As a result of the surface tension of the connection solder 310, the upper solder ball 240 and the lower solder ball 140 may be aligned with each other.

A second process may be performed to attach the upper solder ball 240 to the first solder pad 170. The second process may be performed at a second temperature, which is higher than the melting point of the upper solder ball 240. Accordingly, during the second process, the upper solder ball 240 may be melted. Subsequently, the process temperature may be reduced to room temperature. Accordingly, the melted upper solder ball 240 may be solidified to form the connection terminal 400, and the connection solder 310 may be solidified to form the dummy terminal 320.

As described above, the method may be applied to fabricate a semiconductor package in which the lower semiconductor package 101 with the interposer substrate 160 is provided, but the inventive concept may not be limited thereto. In certain examples, the lower semiconductor package may be or include a chip- or wafer-level semiconductor substrate including a semiconductor layer (e.g., a silicon layer). Thus, the term "chip" may refer to a packaged or bare IC.

In a process of fabricating a semiconductor package, misalignment between upper and lower semiconductor packages may exceed a given tolerance. In particular, as an integration density of a semiconductor device increases, the tolerance for misalignment between the upper and lower semiconductor packages becomes less and less. According to some examples of the inventive concept, the dummy terminal 320 may allow the upper semiconductor package 200 to be aligned with the lower semiconductor package 100 with an increased accuracy.

According to some examples of the inventive concept, a method of fabricating a semiconductor package may include performing a reflow process on an upper dummy ball and a lower dummy ball at a temperature that is lower than melting points of upper and lower solder balls. During the reflow process, the upper and lower dummy balls may be melted to form a connection solder, and a surface tension of the connection solder may make it possible for the upper solder ball to be aligned with the lower solder ball. As a result, the upper solder ball and the lower solder ball may be joined to each other without misalignment.

According to some examples of the inventive concept, a semiconductor package may be fabricated to have high resistance to thermal stress. For example, the semiconductor package may include a dummy terminal, which is disposed adjacent to a semiconductor chip and is used to absorb a mechanical stress to be produced in the semiconductor package. Accordingly, it may be possible to prevent or suppress a mechanical stress from being exerted on a connection terminal for electrically connecting the upper and lower semiconductor packages to each other.

Although examples of the inventive concept have been particularly shown and described, it will be understood by one of ordinary skill in the art that variations in form and detail may be made to such examples without departing from the spirit and scope of the inventive concept as defined by the appended claims.

What is claimed is:

1. A method of fabricating a semiconductor package, comprising:
   providing a lower semiconductor package, the lower semiconductor package comprising a lower package substrate, a lower dummy ball and a lower solder ball on a top surface of the lower package substrate, and a lower semiconductor chip mounted on the top surface of the lower package substrate;
   providing an upper semiconductor package, the upper semiconductor package comprising an upper package substrate, an upper dummy ball and an upper solder ball on a bottom surface of the upper package substrate, and an upper semiconductor chip mounted on a top surface of the upper package substrate;
   joining the upper dummy ball to the lower dummy ball at a first temperature; and
   joining the upper solder ball to the lower solder ball at a second temperature to form a connection terminal,
   wherein, in a plan view, the lower dummy ball is closer than the lower solder ball to the lower semiconductor chip, and
   the upper dummy ball is closer than the upper solder ball to the upper semiconductor chip.

2. The method of claim 1, wherein the second temperature is higher than the first temperature.

3. The method of claim 2, wherein the first temperature is higher than melting points of the upper and lower dummy balls and is lower than melting points of the upper and lower solder balls.

4. The method of claim 2, wherein the second temperature is higher than melting points of the upper and lower solder balls.

5. The method of claim 1, wherein melting points of the upper and lower dummy balls are lower than those of the upper and lower solder balls.

6. The method of claim 1, wherein the upper dummy ball has a width greater than that of the upper solder ball, and
   the lower dummy ball has a width greater than that of the lower solder ball.

7. The method of claim 1, wherein the upper dummy ball and the lower dummy ball are joined to form a dummy joint of solder, and
   the dummy joint of solder is in a liquid state during the forming of the connection terminal.

8. The method of claim 1, further comprising mounting the lower semiconductor package on a board, which is provided on a bottom surface of the lower semiconductor package, before the joining of the upper dummy ball to the lower dummy ball.

9. A method of fabricating a semiconductor package, comprising:
   providing a lower semiconductor package with first and second solder pads;
   stacking an upper semiconductor package including an upper solder ball and an upper dummy ball on the lower semiconductor package; and
   performing a reflow process to connect the upper semiconductor package to the lower semiconductor package,
   wherein the reflow process comprises:
   a first process of joining the upper dummy ball to the first solder pad, the upper solder ball being aligned with the second solder pad during the first process, and
   a second process of joining the upper solder ball to the second solder pad, and
   wherein the upper dummy ball has a width greater than that of the upper solder ball, and a process temperature in the first process is higher than that in the second process.

10. The method of claim 9, wherein a melting point of the upper dummy ball is lower than that of the upper solder ball.

11. The method of claim 9, wherein the upper solder ball is closer to an edge of the upper semiconductor package than the upper dummy ball.

12. The method of claim 9, wherein the lower semiconductor package further comprises:
a lower semiconductor chip mounted on a lower package substrate; and
an interposer substrate provided on the lower semiconductor chip,
wherein the first and second solder pads are disposed at a top surface of the interposer substrate.

13. A method of fabricating a package on package (PoP) semiconductor device, comprising:
providing a lower semiconductor device package comprising a lower package substrate, a lower package chip mounted to the lower package substrate, and conductive members disposed on an upper side of the lower package substrate;
providing an upper semiconductor device package comprising an upper package substrate, an upper package chip mounted to the upper package substrate, and conductive members disposed on a lower side of the upper package substrate;
forming a pre-assemblage comprising the lower and upper semiconductor device packages and in which the lower side of the upper package substrate faces the upper side of the lower package substrate, and dummy members are interposed between the lower side of the upper package substrate and the upper side of the lower package substrate; and
connecting the lower and upper semiconductor device packages of the pre-assemblage to each other both physically and electrically,
wherein the lower package chip is interposed between the lower package substrate and the upper package substrate in the pre-assemblage,
the dummy members each have a volume greater than that of each of the conductive members,
in a plan view of the pre-assemblage, the dummy members are located closer than the conductive members to the lower package chip,
the conductive members comprise solder,
the connecting of the lower and upper semiconductor device packages of the pre-assemblage includes liquefying the dummy members such that surface tension is created at surfaces of the liquefied dummy members, and forming internal electrical connections of the PoP including by reflowing the solder, and
the dummy members are liquefied before the solder is reflowed.

14. The method of claim 13, wherein the dummy members have a melting point, and the solder has a reflow temperature at which the solder begins to reflow,
the reflow temperature of the solder is higher than the melting point of the dummy members, and
the connecting of the lower and upper semiconductor device packages of the pre-assemblage comprises heating the dummy members to a temperature at or above the melting point thereof, and heating the solder to a temperature at or above the reflow temperature after the dummy members have been liquefied.

15. The method of claim 13, wherein the lower semiconductor device package has a lower set of the dummy members disposed on the upper side of the lower package substrate,
the upper semiconductor device package has an upper set of the dummy members disposed on the lower side of the upper package substrate, and
the forming of the pre-assemblage comprises placing the lower set of the dummy members and the upper set of the dummy members against each other.

16. The method of claim 13, wherein
the pre-assemblage comprises an interposer having pads of electrically conductive material interposed between the upper semiconductor device package and the lower package chip, and
the forming of the pre-assemblage comprises placing a set of the dummy members and the interposer against each other.

* * * * *